United States Patent
Hirano et al.

(10) Patent No.: US 9,841,440 B2
(45) Date of Patent: Dec. 12, 2017

(54) CURRENT DETECTION CIRCUIT AND MAGNETIC DETECTION DEVICE PROVIDED WITH SAME

(71) Applicant: Yamaha Corporation, Hamamatsu-shi, Shizuoka (JP)

(72) Inventors: Katsuya Hirano, Hamamatsu (JP); Yasuhiko Sekimoto, Hamamatsu (JP); Norihiro Kawagishi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 8 days.

(21) Appl. No.: 14/907,002

(22) PCT Filed: Jul. 23, 2014

(86) PCT No.: PCT/JP2014/069460
§ 371 (c)(1),
(2) Date: Jan. 22, 2016

(87) PCT Pub. No.: WO2015/012313
PCT Pub. Date: Jan. 29, 2015

(65) Prior Publication Data
US 2016/0161529 A1 Jun. 9, 2016

(30) Foreign Application Priority Data
Jul. 24, 2013 (JP) .................. 2013-153339

(51) Int. Cl.
*G01R 15/14* (2006.01)
*G01R 19/00* (2006.01)
(Continued)

(52) U.S. Cl.
CPC ....... *G01R 15/148* (2013.01); *G01R 19/0092* (2013.01); *G01R 33/09* (2013.01); *G01R 33/093* (2013.01); *G01R 15/205* (2013.01)

(58) Field of Classification Search
CPC combination set(s) only.
See application file for complete search history.

(56) References Cited

U.S. PATENT DOCUMENTS

2011/0101943 A1  5/2011  Kato
2011/0199079 A1  8/2011  Tamura et al.
(Continued)

FOREIGN PATENT DOCUMENTS

CN  102162820 A  8/2011
CN  102253262 A  11/2011
(Continued)

OTHER PUBLICATIONS

International Search Report (PCT/ISA/210) issued in PCT Application No. PCT/JP2014/069460 dated Sep. 9, 2014 with English translation (Two (2) pages).
(Continued)

Primary Examiner — Clayton E Laballe
Assistant Examiner — Jas Sanghera
(74) Attorney, Agent, or Firm — Crowell & Moring LLP (57) ABSTRACT

A current detection circuit includes a coil that is constituted by a metal wiring formed on a semiconductor substrate, a resistor that is provided in a position near the coil on the semiconductor substrate, constituted by a metal wiring formed on the semiconductor substrate, which is made of a metal material being same as that of the coil, and arranged so as to prevent any magnetic field from being generated due to a current flowing in the resistor, an output circuit that outputs currents in accordance with a resistance ratio between the coil and the resistor to the coil and the resistor correspondingly through a common terminal, and a detection circuit that detects the current flowing in the resistor to thereby detect the current flowing in the coil.

15 Claims, 4 Drawing Sheets (51) Int. Cl.
*G01R 33/09* (2006.01)
*G01R 15/20* (2006.01)

(56) References Cited

U.S. PATENT DOCUMENTS

| 2012/0268108 | A1 | 10/2012 | Hozoi et al. | |
|---|---|---|---|---|
| 2012/0326715 | A1* | 12/2012 | Ide | B82Y 25/00 324/252 |
| 2013/0099779 | A1 | 4/2013 | Holman, Jr. | |

FOREIGN PATENT DOCUMENTS

| CN | 202217007 U | 5/2012 |
|---|---|---|
| CN | 202256454 U | 5/2012 |
| CN | 102759649 A | 10/2012 |
| CN | 102928649 A | 2/2013 |
| CN | 103134967 A | 6/2013 |
| JP | 10-247718 A | 9/1998 |
| JP | 2005-188936 A | 7/2005 |
| JP | 2006-71435 A | 3/2006 |
| JP | 2009-188343 A | 8/2009 |
| JP | 2011-95146 A | 5/2011 |
| JP | 2012-58150 A | 3/2012 |
| WO | WO 2011/111537 A1 | 9/2011 |
| WO | WO 2013/018665 A1 | 2/2013 |

OTHER PUBLICATIONS

Japanese-language Written Opinion (PCT/ISA/237) issued in PCT Application No. PCT/JP2014/069460 dated Sep. 9, 2014 (Three (3) pages).
Chinese Office Action issued in counterpart Chinese Application No. 201480041592.X dated Jun. 20, 2017 with English translation (10 pages).

* cited by examiner

RELATED ART

CURRENT DETECTION CIRCUIT AND MAGNETIC DETECTION DEVICE PROVIDED WITH SAME

TECHNICAL FIELD

The present invention relates to a current detection circuit for detecting a current flowing in a coil, and a magnetic detection device provided with the current detection circuit.

BACKGROUND ART

A current detection circuit formed on a semiconductor substrate has been known in the background art. For example, Patent Literature 1 discloses a configuration that a detection MOSFET is provided in parallel with an output MOSFET serving for applying a current to a load such as a coil, and the detection MOSFET mirrors an output current outputted to the load by the output MOSFET in order to perform current detection. According to the configuration of the current detection device, the detection MOSFET is formed in a size (plane area) smaller than the size of the output MOSFET. Due to the configuration, a minute detection current in which the output current is mirrored with a magnification corresponding to a ratio between the size of the detection MOSFET and the size of the output MOSFET can be detected to monitor the output current.

In the background art, it has been well known that a spiral metal wiring is formed on a semiconductor substrate so that a coil can be formed integrally on the semiconductor substrate (e.g. Patent Literature 2).

CITATION LIST

Patent Literature

Patent Literature 1: JP-A-2011-95146
Patent Literature 2: JP-A-2009-188343

SUMMARY OF INVENTION

Technical Problem

In recent years, it has been desired that a current flowing in the coil constituted by the metal wiring integrally formed on the semiconductor substrate can be detected accurately. However, when the current detection device as disclosed in Patent Literature 1 is used, there is a problem that the circuit configuration may be complicated and the circuit scale may be increased.

Figure 4:
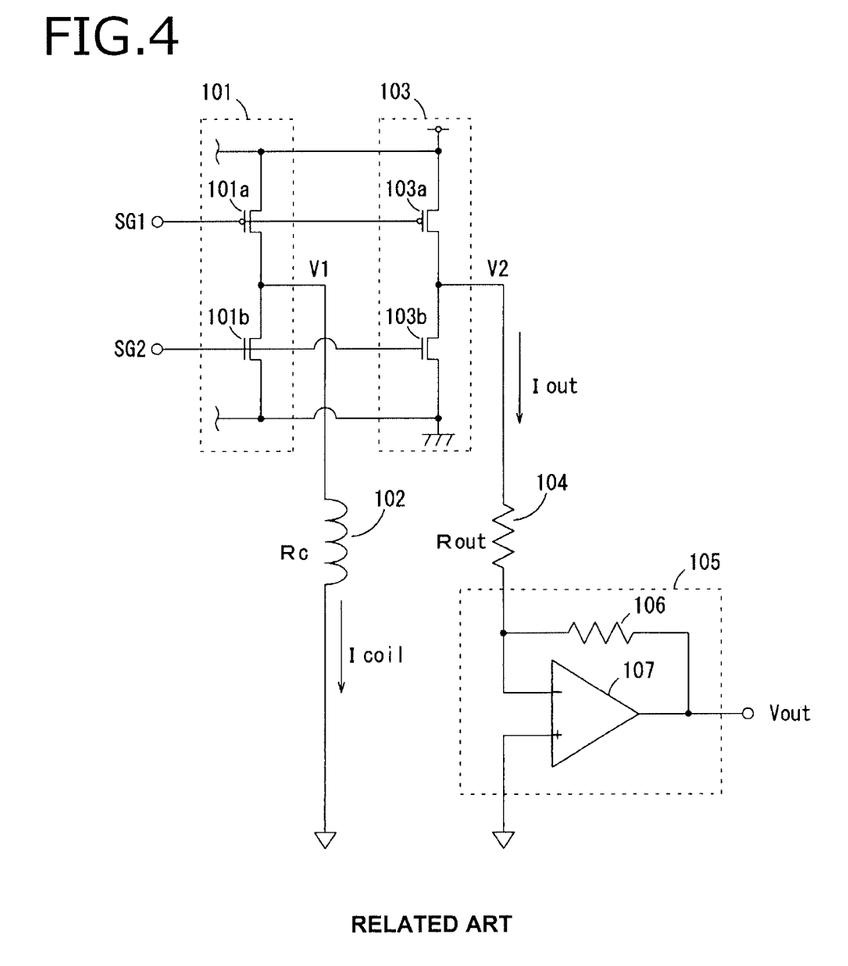
FIG. 4 is a view showing an example of a circuit detecting a current flowing in a coil.

Therefore, it has been considered that a relatively simple circuit configuration, for example, as shown in FIG. 4 is used to detect a current flowing in a coil. A circuit example shown in FIG. 4 has a configuration including an output buffer 101, a coil 102, a replica circuit 103 of the output buffer 101, a resistor 104 having a resistance value M times (M>1) as high as that of the coil 102, and an IV conversion circuit 105.

The output buffer 101 has a configuration that a P-type MOS transistor 101a and a N-type MOS transistor 101b are connected in series. The output buffer 101 outputs a coil current Icoil to the coil 102 in accordance with a driving signal SG1 or SG2 inputted to a gate of each MOS transistor 101a or 101b. The coil 102 is constituted by a spiral metal wiring formed on a semiconductor substrate.

The replica circuit 103 has a configuration that a P-type transistor 103a and a N-type MOS transistor 103b are connected in series and the P-type and N-type MOS transistors 103a and 103b operate based on the same driving signal SG1 or SG2 as that of the output buffer 101. The replica circuit 103 outputs a current Iout to the resistor 104 in accordance with the driving signal SG1 or SG2 inputted to a gate of each MOS transistor 103a or 103b. The resistor 104 is formed by polysilicon on the semiconductor substrate. In a case that the size of each MOS transistor 103a or 103b of the replica circuit 103 is set to be 1/M times as large as the size of each MOS transistor 101a or 101b of the output buffer 101, the current Iout outputted from the replica circuit 103 becomes 1/M times as high as the coil current Icoil outputted from the output buffer 101 to the coil 102. A resistance value Rout of the resistor 104 is M times as high as a resistance value Rc of the coil 102. Accordingly, a potential V1 of an output terminal of the output buffer 101 and a potential V2 of an output terminal of the replica circuit 103 become equal to each other.

The IV conversion circuit 105 includes a resistor 106 and an operational amplifier 107. The IV conversion circuit 105 applies the current Iout flowing in the resistor 104 to the resistor 106 to perform IV conversion on the current Iout. That is, assume that a resistance value of the resistor 106 is r. In this case, an output Vout of the IV conversion circuit 105 holds the relation Vout=r·Iout. Here, since the current Iout flowing in the resistor 104 holds the relation Iout=(1/M)·Icoil, the output Vout of the IV conversion circuit 105 holds the relation Vout=−(r/M)·Icoil. Accordingly, the circuit shown in FIG. 4 has an advantage that it can detect the current Icoil flowing in the coil 102 without complicating the circuit configuration.

On the other hand, when the simple circuit configuration as shown in FIG. 4 is used, there arises a new problem that current detection accuracy may deteriorate due to a difference in temperature characteristic between the coil 102 constituted by the metal wiring formed on the semiconductor substrate and the resistor 104 formed by polysilicon. For example, polysilicon, in which resistance value change relative to temperature change can be suppressed to a comparatively small value, is selected to form the resistor 104. Accordingly, the resistance value change of the resistor 104 relative to the temperature change can be suppressed to be small. On the other hand, the coil 102 which is constituted by the metal wiring of aluminum (Al), copper (Cu), etc. has a larger resistance value change relative to the temperature change than that of polysilicon. Accordingly, the temperature characteristic of the resistor 104 and the temperature characteristic of the coil 102 become inconsistent with each other. Therefore, the relation between the resistance value Rc of the coil 102 and the resistance value Rout of the resistor 104 particularly in a high temperature region is largely deviated from 1:M and the current Iout flowing in the resistor 104 is not 1/M times as high as the coil current Icoil. Accordingly, it is not possible to detect the coil current Icoil accurately.

The invention has been accomplished in order to solve the foregoing problem. An object of the invention is to provide a current detection circuit which has a comparatively simple circuit configuration to be able to accurately detect a current flowing in a coil constituted by a metal wiring formed on a semiconductor substrate even when environmental temperature changes, and a magnetic detection device provided with the current detection circuit.

Solution to Problems

In order to achieve the object, the current detection circuit according to the invention includes: a coil that is constituted by a metal wiring formed on a semiconductor substrate; a resistor that is provided in a position near the coil on the semiconductor substrate, constituted by a metal wiring formed on the semiconductor substrate, which is made of a metal material being same as that of the coil, and arranged so as to prevent any magnetic field from being generated due to a current flowing in the resistor; an output circuit that outputs currents in accordance with a resistance ratio between the coil and the resistor to the coil and the resistor correspondingly through a common terminal at which one end of the coil and one end of the resistor are connected to each other; and a detection circuit that detects the current flowing in the resistor to thereby detect the current flowing in the coil.

In addition, the magnetic detection device according to the invention includes: a coil that is constituted by a metal wiring formed on a semiconductor substrate; a resistor that is provided in a position near the coil on the semiconductor substrate, constituted by a metal wiring formed on the semiconductor substrate, which is made of a metal material being same as that of the coil, and arranged so as to prevent any magnetic field from being generated due to a current flowing in the resistor; a magnetic detection portion that is disposed in a place near the coil and that detects an external magnetic field; and a circuit that applies currents to the coil and the resistor correspondingly when the magnetic detection portion detects the external magnetic field.

Advantageous Effects of Invention

According to the invention, it is possible to make the circuit configuration simple, and it is possible to always accurately detect the current flowing in the coil even when environmental temperature changes.

BRIEF DESCRIPTION OF DRAWINGS

FIG. 1 (*a*) is a view showing an example of configuration of a current detection device in which a magnetic detection device is disposed in a predetermined position around a bus bar, and FIG. 1 (*b*) is a view for explaining how the magnetic detection device detects a magnetic field occurring due to a current flowing in the bus bar.

FIG. 2 (*a*) is a circuit diagram showing an example of configuration of the magnetic detection device provided with the current detection circuit, and FIG. 2 (*b*) is a circuit diagram showing an example of configuration of the current detection circuit.

FIG. 3 (*a*) and FIG. 3 (*b*) are views showing an example of a pattern in which a coil and a resistor are formed on a semiconductor substrate, and FIG. 3 (*c*) is a sectional view taken along a line A-A for showing a wiring pattern of the resistor in FIG. 3 (*b*).

DESCRIPTION OF EMBODIMENT

A preferred embodiment concerned with the invention will be described below in detail with reference to the drawings. Incidentally, elements common to each other in the embodiments which will be described below will be referenced with one and the same numeral, and duplicate description about those common elements will be omitted.

Figure 1:
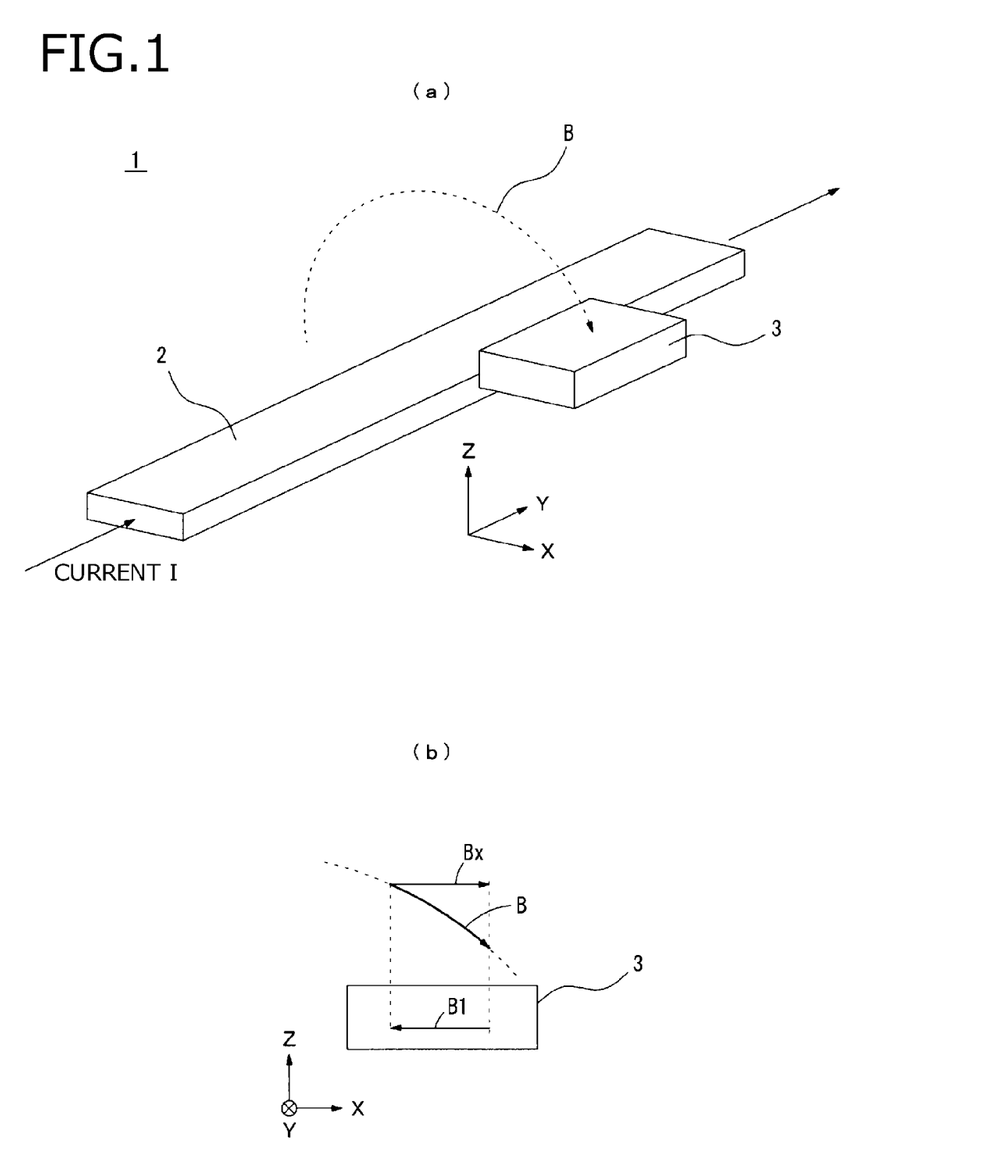

FIG. 1 illustrates an example of configuration of a current detection device 1 including a magnetic detection device 3 provided with a current detection circuit according to the invention. For example, as shown in FIG. 1(*a*), the current detection device 1 has a configuration that a bus bar 2 is disposed along a Y direction and the magnetic detection device 3 is provided in a predetermined position around the bus bar 2. A current I flows, for example, in the Y direction, in the bus bar 2. On this occasion, a clockwise magnetic field B occurs around the bus bar 2 in accordance with Ampere's law, as shown in FIG. 1(*a*). The magnetic field B is proportional to the magnitude of the current I flowing in the bus bar 2.

The magnetic detection device 3 detects the magnetic field B occurring around the bus bar 2 in the predetermined position to thereby detect the current I flowing in the bus bar 2. Specifically, the magnetic detection device 3 has the following configuration. That is, as shown in FIG. 1(*b*), the magnetic detection device 3 detects a predetermined-direction (e.g. an X-direction) magnetic field component Bx of the magnetic field B occurring due to the current I flowing in the bus bar 2, and generates a magnetic field B1 for cancelling the magnetic field component Bx inside the magnetic detection device 3. Thus, the magnetic detection device 3 detects the magnetic field B occurring due to the current I.

Figure 2:
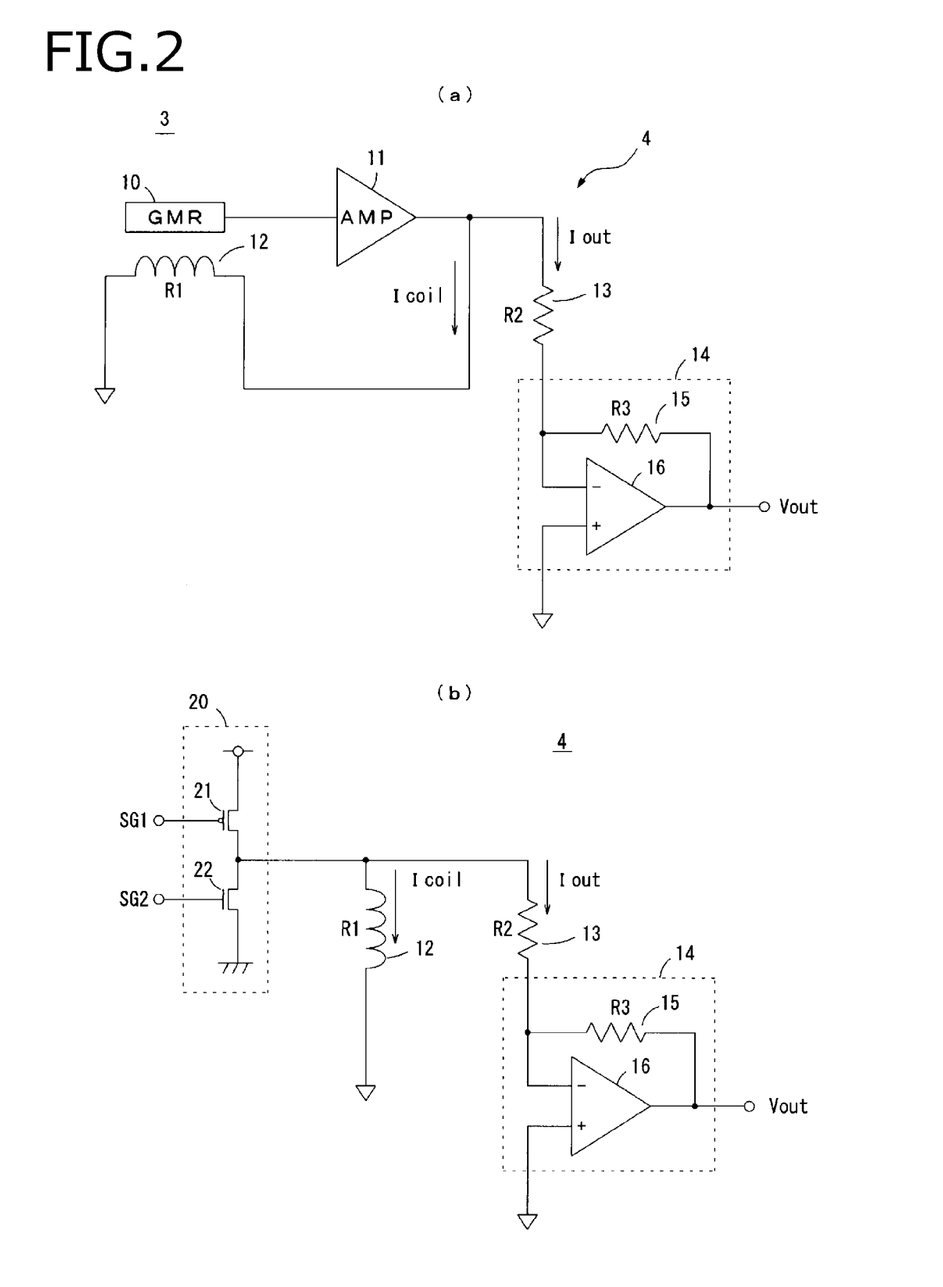

FIG. 2 illustrates circuit diagrams showing an example of configuration of the magnetic detection device 3. As shown in FIG. 2(*a*), the magnetic detection device 3 includes a magnetic detection element 10, an amplifier 11, a coil 12, a resistor 13, and an IV conversion circuit 14. In the magnetic detection device 3, the magnetic detection element 10, the amplifier 11, the coil 12, the resistor 13, and the IV conversion circuit 14 are integrally formed on a semiconductor substrate. In addition, the magnetic detection device 3 is provided with a current detection circuit 4 constituted by a part of the amplifier 11, the coil 12, the resistor 13, and the IV conversion circuit 14. That is, as shown in FIG. 2(*b*), the current detection circuit 4 includes an output circuit 20 provided in an output stage of the amplifier 11, the coil 12, the resistor 13, and the IV conversion circuit 14.

The magnetic detection element 10 is an element which detects the predetermined-direction magnetic field component Bx (external magnetic field Bx) of the magnetic filed B occurring due to the current I flowing in the bus bar 2. For example, the magnetic detection element 10 is constituted by a magneto resistive effect element whose electric resistance changes in accordance with the external magnetic field Bx. The case where a GMR (Giant Magneto Resistive effect) element which exerts a GMR effect with a large resistance change is particularly used among magneto resistive effect elements is shown in FIG. 2(*a*). When the resistance value of the magnetic detection element 10 is changed in accordance with the external magnetic field Bx, the potential of a contact point of the magnetic detection element 10 (an input of the amplifier 11) connected to the amplifier 11 is changed in accordance with the change of the resistance value.

The amplifier 11 outputs, to the coil 12, a coil current Icoil in accordance with the external magnetic field Bx detected by the magnetic detection element 10, in order to generate the magnetic field B1 for cancelling the external magnetic field Bx in accordance with the external magnetic field Bx. When, for example, the input potential of the amplifier 11 changes in accordance with the change of the resistance value of the magnetic detection element 10, the amplifier 11 outputs, to the coil 12, the coil current Icoil in accordance with the change of the input potential.

In addition, as shown in FIG. 2(*b*), the amplifier 11 has the output circuit 20 in which a P-type MOS transistor 21 and a N-type MOS transistor 22 are connected in series. The amplifier 11 is configured to output, to the coil 12, a coil current Icoil in accordance with a driving signal SG1 or SG2 inputted to a gate of each MOS transistor 21 or 22.

The coil 12 is formed in a position near the magnetic detection element 10 on the semiconductor substrate. The coil 12 is constituted by a metal wiring of aluminum (Al), copper (Cu), etc. which is formed into a spiral shape. The coil 12 generates the magnetic field B1 due to the coil current Icoil outputted from the amplifier 11 and applies the generated magnetic field B1 to the magnetic detection element 10 so that the magnetic field B1 can cancel the external magnetic field Bx acting on the magnetic detection element 10. In addition, the coil 12 has a resistance value R1 in accordance with the material, the sectional area and the wiring length of the metal wiring. The resistance value R1 fluctuates in accordance with the change of environmental temperature.

The resistor 13 is formed on the semiconductor substrate, similarly to the coil 12. For example, the resistor 13 is formed to have a resistance value R2 which is M times (M≥1) as large as the resistance value R1 of the coil 12. That is, a resistance ratio between the coil 12 and the resistor 13 holds the relation R1:R2=1:M. Incidentally, the value M is preferably not smaller than 10. One end of the resistor 13 is connected to an output terminal of the amplifier 11 (an output terminal of the output circuit 20) and also connected to one end of the coil 12. In addition, the other end of the resistor 13 is connected to the IV conversion circuit 14. Accordingly, when the amplifier 11 outputs the coil current Icoil to the coil 12, an output current Iout equal to 1/M of the coil current Icoil flows into the resistor 13. That is, the amplifier 11 is a circuit by which the coil current Icoil in accordance with the external magnetic field Bx detected by the magnetic detection element 10 is outputted to the coil 12 through a common terminal at which the output terminal of the amplifier 11, i.e. the one end of the coil 12 and the one end of the resistor 13 are connected to each other, while the output current Iout equal to 1/M of the coil current Icoil is outputted to the resistor 13.

Figure 3:
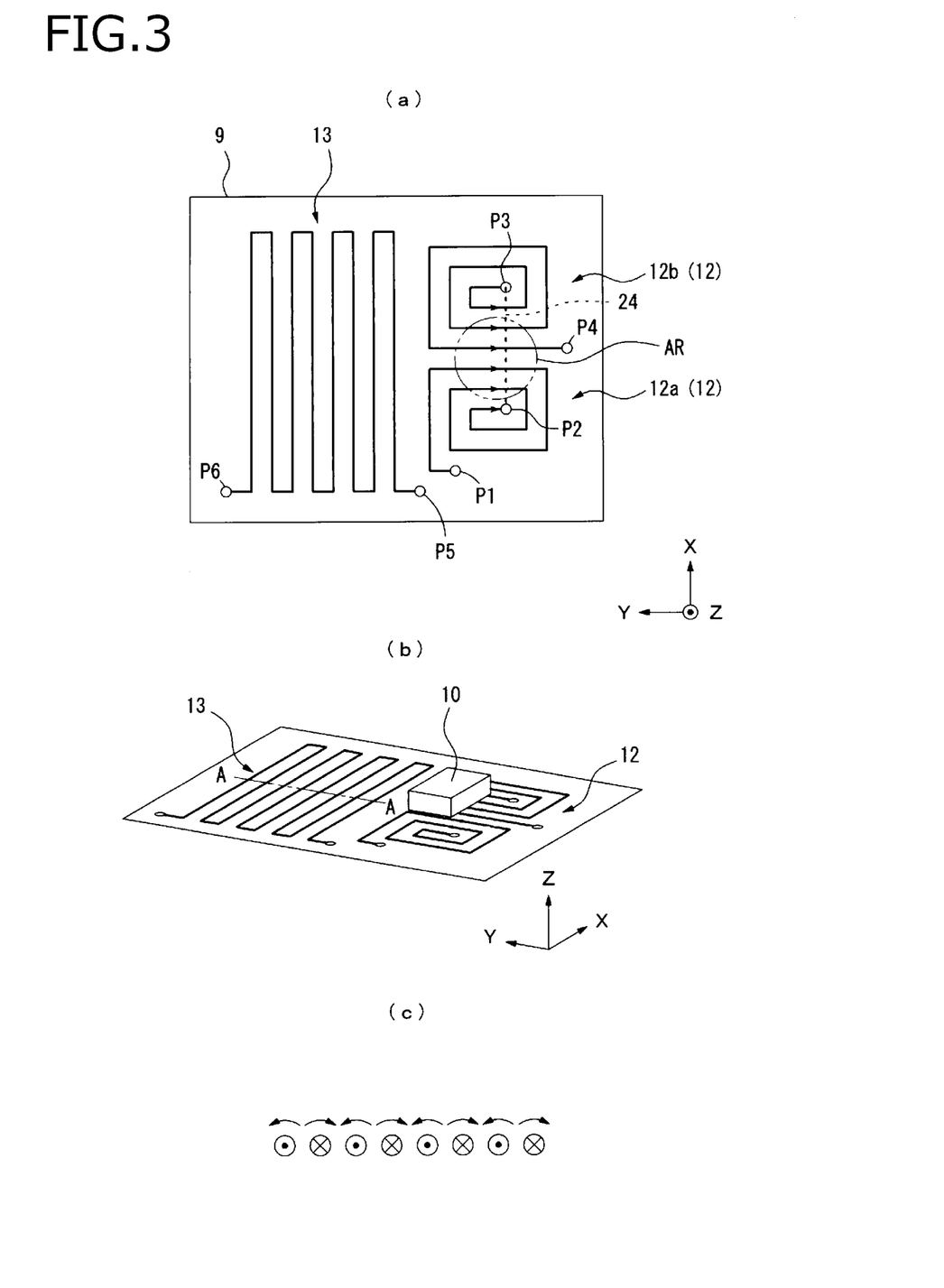

The resistor 13 is provided in a position near the coil 12 on the semiconductor substrate and constituted by a metal wiring formed on the semiconductor substrate, which is made of a metal material being same as that of the coil 12. FIG. 3 shows an example of a pattern in which the coil 12 and the resistor 13 are formed on the semiconductor substrate. As shown in FIG. 3(a), the coil 12 and the resistor 13 are formed in a specific metal wiring layer of a semiconductor substrate 9 having a multilayer structure. The coil 12 is constituted by two coils, i.e. a first coil 12a and a second coil 12b. The first coil 12a is constituted by a spiral metal wiring pattern arranged clockwise and gradually inward from a first contact point P1 to a second contact point P2. The second coil 12b is constituted by a spiral metal wiring pattern arranged counterclockwise and gradually outward from a third contact point P3 to a fourth contact point P4. The second contact point P2 and the third contact point P3 are connected to a metal wiring 24 formed in another metal wiring layer through contact holes etc. and made electrically conductive to each other through the metal wiring 24. In addition, the first contact point P1 is connected to the output terminal of the amplifier 11. The fourth contact point P4 is connected to a reference potential.

Accordingly, when the coil current Icoil flows in the coil 12 by the amplifier 11, the coil current Icoil becomes a current flowing in one and the same direction in an area AR between the second contact point P2 and the third contact point P3. The coil current Icoil generates a fixed-direction magnetic field B1 directed to above or below the area AR. In the embodiment, as shown in FIG. 3(b), the magnetic detection element 10 is provided in a position near the coil 12 above or below the area AR so that the fixed-direction magnetic field B1 occurring in the coil 12 can be applied uniformly to the magnetic detection element 10. The coil 12 is not always limited to the one having two coils 12a and 12b but may be one constituted by one coil.

On the other hand, the resistor 13 is constituted by a metal wiring pattern which is formed of the same metal material as that of the coil 12 so as to be located adjacently to the coil 12 constituted by the first coil 12a and the second coil 12b. However, the resistor 13 is arranged so as to prevent any magnetic field from being generated due to a current flowing in the resistor 13. For example, as shown in FIG. 3(a), the resistor 13 is constituted by a plurality of metal wirings which are made of a metal material being same as that of the coil 12 so that an even number of parallel metal wirings are folded back like rectangular waves between a fifth contact point P5 and a sixth contact point P6. The reason why the even number of parallel wirings are folded back as the wiring pattern of the resistor 13 here is that a magnetic field occurring due to the wiring pattern of each parallel wiring can be cancelled by magnetic fields occurring due to the wiring patterns of other wirings adjacent thereto. That is, as shown in FIG. 3(c), currents flow in reverse directions in two wiring patterns adjacent to each other in the patterns of the even number of wirings arranged in parallel. Therefore, a magnetic field which occurs due to a current flowing in one wiring pattern is cancelled by magnetic fields occurring due to currents flowing in other wiring patterns adjacent thereto. When the number of wiring patterns arranged in parallel is set to be even, any magnetic field can be prevented from being generated as the whole of the resistor 13.

In addition, the resistor 13 is designed in advance in such a manner that the resistor 13 is made smaller in wiring width than the coil 12 or the resistor 13 is made longer in wiring length than the coil 12, so that the resistor 13 can have a resistance value R2 which is M times as large as the resistance value R1 of the coil 12. In addition, the resistor 13 may be adjusted in such a manner that not only the wiring width or the wiring length of the resistor 13 is adjusted but the metal layer of the resistor 13 is also formed to be thinner in film thickness than the coil 12 so that the resistance ratio between the coil 12 and the resistor 13 can be 1:M.

Thus, the resistor 13 formed on the same semiconductor substrate 9 as the coil 12 is constituted by a metal wiring using the same metal material as that of the coil 12. Accordingly, the resistor 13 exhibits the same temperature characteristic as the coil 12. That is, when the resistance value R1 of the coil 12 changes due to a temperature change, the resistance value R2 of the resistor 13 also changes by the same rate as the resistance value R1 of the coil 12. As a result, even when the environmental temperature changes to any temperature, the resistance ratio between the coil 12 and the resistor 13 is kept at 1:M.

Return to FIG. 2. The IV conversion circuit 14 is a detection circuit which detects the current flowing in the resistor 13 to thereby detect the coil current Icoil flowing in the coil 12. The IV conversion circuit 14 includes a resistor 15 and an operational amplifier 16. The IV conversion circuit 14 applies the current Iout flowing in the resistor 13 to the resistor 15 to perform IV conversion on the current Iout. That is, assume that a resistance value of the resistor 15 is R3. In this case, the output Vout of the IV conversion circuit 14 holds the relation Vout=−R3·Iout.

The resistor 15 is a resistor which is formed on the semiconductor substrate 9 and selectively out of polysilicon low in temperature sensitivity. Change in resistance value of the polysilicon relative to temperature change is smaller than a predetermined value. Therefore, the area of the resistor 15 can be formed with a considerably small size in comparison with the resistor 13. In addition, the resistance value R3 of the resistor 15 can be prevented from being changed too much even in the case where environmental temperature changes. Due to this configuration, in the case where the IV conversion circuit 14 is used under any temperature environment, the output Vout of the IV conversion circuit 14 can hold the relation Vout=−R3·Iout. Here, since the current Iout flowing in the resistor 13 holds the relation Iout=(1/M)·Icoil, the output Vout of the IV conversion circuit 14 holds the relation Vout=−(R3/M)·Icoil. Accordingly, the current detection circuit 4 shown in FIG. 2(*b*) has an advantage that it can accurately detect the current Icoil flowing in the coil 12 without complicating the circuit configuration.

Particularly, in the embodiment, the coil 12 and the resistor 13 are provided in positions near each other in the semiconductor substrate 9 and operate under one and the same temperature conditions. In addition, since the coil 12 and the resistor 13 are made of one and the same metal material, the temperature characteristic of the coil 12 and the temperature characteristic of the resistor 13 are one and the same in terms of their resistance values, as described above. Therefore, even in the case where the environmental temperature changes, the relation between the resistance value R1 of the coil 12 and the resistance value R2 of the resistor 13 is not deviated from 1:M so that the current Iout flowing in the resistor 13 under any temperature environment can be kept at 1/M times as high as the coil current Icoil. Therefore, the aforementioned relation Vout=−(R3/M)·Icoil is always established so that there is an advantage that the current Icoil flowing in the coil 12 can be always detected accurately based on the output Vout of the IV conversion circuit 14.

In addition, the output Vout of the IV conversion circuit 14 is an output signal in accordance with the external magnetic field Bx detected by the magnetic detection element 10. Therefore, the external magnetic field Bx (and the magnetic field B) can be also always detected accurately based on the output Vout. Accordingly, the magnetic detection device 3 can always accurately detect the external magnetic field Bx (and the magnetic field B) acting on the magnetic detection element 10.

In addition, the output Vout of the IV conversion circuit 14 becomes an output signal in accordance with the current I flowing in the bus bar 2. Therefore, the current I flowing in the bus bar 2 can be also always detected accurately based on the output Vout. Therefore, the magnetic detection device 3 according to the embodiment can be used also as a current detection sensor which detects the current I flowing in the bus bar 2 in the current detection device 1.

Further, in the embodiment, the coil 12 and the resistor 13 are made of the same metal material and the resistance ratio between the coil 12 and the resistor 13 is kept at 1:M regardless of temperature. Accordingly, it is not necessary to provide a replica circuit for separately generating a current which is 1/M times as high as the coil current Icoil. Therefore, in comparison with the circuit configuration in FIG. 4, the circuit configuration according to the embodiment is further simpler so that there is also an advantage that the circuit scale can be reduced remarkably. Thus, the size of the current detection circuit 4 and the size of the magnetic detection device 3 provided with the current detection circuit 4 can be reduced remarkably.

As described above, the current detection circuit 4 according to the embodiment includes the coil 12 and the resistor 13. The coil 12 is constituted by a metal wiring formed on the semiconductor substrate 9. The resistor 13 is provided in a position near the coil 12 on the semiconductor substrate 9, constituted by a metal wiring being made of a metal material which is same as that of the coil 12, and arranged so as to prevent any magnetic field from being generated due to a current flowing in the resistor 13. The current detection circuit 4 according to the embodiment can be configured so that temperature characteristic of the coil 12 and temperature characteristic of the resistor 13 can be one and the same in terms of their resistance values and the resistance ratio between the coil 12 and the resistor 13 can be prevented from changing due to temperature change. When the output circuit 20 outputs the currents Icoil and Iout in accordance with the resistance ratio between the coil 12 and the resistor 13 to the coil 12 and the resistor 13 correspondingly, and the IV conversion circuit 14 detects the current Iout flowing in the resistor 13 to thereby always detect the current Icoil flowing in the coil 12 accurately.

In addition, the resistance value R2 of the resistor 13 is set as a value larger than the resistance value R1 of the coil 12. Thus, the current Iout flowing in the resistor 13 can be made smaller than the current Icoil flowing in the coil 12. As a result, the output current Iout for detecting the coil current Icoil can be reduced so that power consumption in the current detection circuit 4 can be suppressed.

In addition, the magnetic detection device 3 according to the embodiment is configured in such a manner that the coil 12 is disposed in a place near the magnetic detection element 10, and the output circuit 20 of the amplifier 11 applies, to the coil 12, the coil current Icoil for generating the magnetic field B1 which can cancel the external magnetic field Bx detected by the magnetic detection element 10. The IV conversion circuit 14 serving as a detection circuit has a configuration that it can detect the current Iout flowing in the resistor 13 to thereby always accurately output a magnetic signal (a current or a voltage) in accordance with the external magnetic field Bx.

Although an embodiment of the invention has been described above, the invention is not limited to the aforementioned one but various modifications can be used. For example, in the embodiment, the IV conversion circuit 14 provided with the resistor 15 and the operational amplifier 16 is shown as a detection circuit for detecting the current Iout flowing in the resistor 13 by way of example. However, the detection circuit for detecting the current Iout flowing in the resistor 13 is not limited to the aforementioned IV conversion circuit 14 but any other circuit may be used.

The disclosure will be summarized as follows.

A current detection circuit according to the invention includes: a coil that is constituted by a metal wiring formed on a semiconductor substrate; a resistor that is provided in a position near the coil on the semiconductor substrate, constituted by a metal wiring formed on the semiconductor substrate, which is made of a metal material being same as that of the coil, and arranged so as to prevent any magnetic field from being generated due to a current flowing in the resistor; an output circuit that outputs currents in accordance with a resistance ratio between the coil and the resistor to the coil and the resistor correspondingly through a common terminal at which one end of the coil and one end of the resistor are connected to each other; and a detection circuit that detects the current flowing in the resistor to thereby detect the current flowing in the coil.

According to the configuration, the coil and the resistor can be formed to have the same temperature characteristic in terms of their resistance values. Accordingly, there is no fear that the resistance ratio between the coil and the resistor may change due to temperature change but the current flowing in the coil can be always detected accurately if the current flowing in the resistor is detected.

Incidentally, the term "near" in the expression "the resistor is provided in a position near the coil" is defined as follows. In a metal material distributed within a predetermined plane of the semiconductor substrate, there may occur a variation in characteristic in accordance with a distribution position of the metal material. However, the distance between the coil and the resistor, in which metal materials of the coil and the resistor have substantially the same characteristic in their distribution positions and the coil and the resistor are close to each other enough to allow the current detection device to secure its fixed performance, is defined as "near".

For example, the resistor is constituted by a plurality of metal wirings which is made of a metal material being same as that of the coil, an even number of the metal wirings being arranged in parallel to each other in the position near the coil.

According to the configuration, the resistor which can prevent any magnetic field from being generated due to a current flowing in the resistor can be formed relatively easily.

For example, the resistor has a resistance value larger than that of the coil, and the current flowing in the resistor is smaller than the current flowing in the coil.

According to the configuration, power consumption can be suppressed.

For example, the semiconductor substrate has a multilayer structure, and the coil and the resistor are formed in a specific metal wiring layer in the semiconductor substrate.

For example, the coil includes a first coil and a second coil, the first coil is constituted by a spiral metal wiring pattern arranged clockwise and gradually inward from a first contact point to a second contact point, and the second coil is constituted by a spiral metal wiring pattern arranged counterclockwise and gradually outward from a third contact point to a fourth contact point. Also, the second contact point and the third contact point may be electrically conductive to each other.

For example, a magnetic detection device according to the invention may include: the current detection circuit; and a magnetic detection portion which detects an external magnetic field; wherein: the coil is disposed in a place near the magnetic detection portion; the output circuit applies, to the coil, a current for generating a magnetic field which can cancel the external magnetic field detected by the magnetic detection portion; and the current detection circuit detects a current flowing in the resistor to thereby output a current or a voltage in accordance with the external magnetic field.

According to the configuration, it is possible to accurately output a current or a voltage in accordance with an external magnetic field under any temperature environment.

For example, coil currents flowing respectively in the first coil and the second coil flow in the same direction in an area between the second contact point and the third contact point so that a fixed-direction magnetic field occurs above or below the area. The magnetic detection portion may be disposed above or below the area.

In addition, a magnetic detection device according to the invention includes: a coil that is constituted by a metal wiring formed on a semiconductor substrate; a resistor that is provided in a position near the coil on the semiconductor substrate, constituted by a metal wiring formed on the semiconductor substrate, which is made of a metal material being same as that of the coil, and arranged so as to prevent any magnetic field from being generated due to a current flowing in the resistor; a magnetic detection portion that is disposed in a place near the coil and detects an external magnetic field; and a circuit that applies currents to the coil and the resistor respectively when the magnetic detection portion detects the external magnetic field.

For example, the magnetic detection device may further include: a detection circuit that detects the current flowing in the resistor to thereby detect the current flowing in the coil.

For example, the resistor is constituted by a plurality of metal wirings which is made of a metal material being same as that of the coil, an even number of the metal wirings being arranged in parallel to each other in the position near the coil.

For example, the resistor has a resistance value larger than that of the coil, and the current flowing in the resistor is smaller than the current flowing in the coil.

For example, the semiconductor substrate has a multilayer structure, and the coil and the resistor are formed in a specific metal wiring layer in the semiconductor substrate.

For example, the coil includes a first coil and a second coil, and the first coil is constituted by a spiral metal wiring pattern arranged clockwise and gradually inward from a first contact point to a second contact point, the second coil is constituted by a spiral metal wiring pattern arranged counterclockwise and gradually outward from a third contact point to a fourth contact point, and the second contact point and the third contact point may be electrically conductive to each other.

For example, coil currents flowing respectively in the first coil and the second coil flow in the same direction in an area between the second contact point and the third contact point so that a fixed-direction magnetic field occurs above or below the area, and the magnetic detection portion is disposed above or below the area.

Although the invention has been described in detail or with reference to a specific embodiment, it is obvious to those skilled in the art that various changes or modifications can be made without departing from the spirit and scope of the invention.

The present application is based on a Japanese patent application (Patent Application No. 2013-153339) which is filed on Jul. 24, 2013 and the contents of which are incorporated herein by reference.

INDUSTRIAL APPLICABILITY

According to the current detection circuit and the magnetic detection device provided with the current detection circuit according to the invention, it is possible to accurately detect a current flowing in the coil constituted by a metal wiring formed on the semiconductor substrate even when environmental temperature changes.

REFERENCE SIGNS LIST

3 . . . magnetic detection device, 4 . . . current detection circuit, 9 . . . semiconductor substrate, 10 . . . magnetic detection element, 11 . . . amplifier, 12 . . . coil, 13 . . . resistor, 14 . . . IV conversion circuit (detection circuit), 20 . . . output circuit

The invention claimed is:

1. A current detection circuit comprising:
a coil that is constituted by a metal wiring formed on a semiconductor substrate;
a resistor that is provided in a position adjacent to the coil on the semiconductor substrate, constituted by a metal wiring formed on the semiconductor substrate, which is made of a metal material being same as that of the coil, and arranged so as to prevent any magnetic field from being generated due to a current flowing in the resistor;
an output circuit that outputs currents in accordance with a resistance ratio between the coil and the resistor to the coil and the resistor correspondingly through a common terminal at which one end of the coil and one end of the resistor are connected to each other; and
a detection circuit that detects the current flowing in the resistor to thereby detect the current flowing in the coil.

2. The current detection circuit according to claim 1, wherein the resistor is constituted by a plurality of metal wirings which is made of a metal material being same as that of the coil, an even number of the metal wirings being arranged in parallel to each other.

3. The current detection circuit according to claim 1, wherein the resistor has a resistance value larger than that of the coil.

4. The current detection circuit according to claim 1, wherein the semiconductor substrate has a multilayer structure, and the coil and the resistor are formed in a specific metal wiring layer in the semiconductor substrate.

5. The current detection circuit according to claim 1, wherein the coil includes a first coil and a second coil; and
wherein the first coil is constituted by a spiral metal wiring pattern arranged clockwise and gradually inward from a first contact point to a second contact point, the second coil is constituted by a spiral metal wiring pattern arranged counterclockwise and gradually outward from a third contact point to a fourth contact point, and the second contact point and the third contact point are electrically conductive to each other.

6. A magnetic detection device comprising:
a current detection circuit according to claim 5; and
a magnetic detection portion that detects an external magnetic field,
wherein the coil is disposed in a place adjacent to the magnetic detection portion;
wherein the output circuit applies, to the coil, a current for generating a magnetic field to cancel the external magnetic field detected by the magnetic detection portion;
wherein the detection circuit detects a current flowing in the resistor to thereby output a current or a voltage in accordance with the external magnetic field;
wherein coil currents flowing respectively in the first coil and the second coil flow in the same direction in an area between the second contact point and the third contact point so that a fixed-direction magnetic field occurs above or below the area; and
wherein the magnetic detection portion is disposed above or below the area.

7. A magnetic detection device comprising:
a current detection circuit according to claim 1; and
a magnetic detection portion that detects an external magnetic field,
wherein the coil is disposed in a place adjacent to the magnetic detection portion;
wherein the output circuit applies, to the coil, a current for generating a magnetic field to cancel the external magnetic field detected by the magnetic detection portion; and
wherein the detection circuit detects a current flowing in the resistor to thereby output a current or a voltage in accordance with the external magnetic field.

8. The current detection circuit according to claim 1, wherein the resistor and the coil are connected through the common terminal so that a current flowing through the resistor and a current flowing in the coil are proportional with a resistance value of the resistor and a resistance value of the coil.

9. A magnetic detection device comprising:
a coil that is constituted by a metal wiring formed on a semiconductor substrate;
a resistor that is provided in a position adjacent to the coil on the semiconductor substrate, constituted by a metal wiring formed on the semiconductor substrate, which is made of a metal material being same as that of the coil, and arranged so as to prevent any magnetic field from being generated due to a current flowing in the resistor;
a magnetic detection portion that is disposed in a place adjacent to the coil and detects an external magnetic field; and
a circuit that applies currents to the coil and the resistor respectively when the magnetic detection portion detects the external magnetic field.

10. The magnetic detection device according to claim 9, further comprising:
a detection circuit that detects the current flowing in the resistor to thereby detect the current flowing in the coil.

11. The magnetic detection device according to claim 9, wherein the resistor is constituted by a plurality of metal wirings which is made of a metal material being same as that of the coil, an even number of the metal wirings being arranged in parallel to each other.

12. The magnetic detection device according to claim 9, wherein the resistor has a resistance value larger than that of the coil.

13. The magnetic detection device according to claim 9, wherein the semiconductor substrate has a multilayer structure, and the coil and the resistor are formed in a specific metal wiring layer in the semiconductor substrate.

14. The magnetic detection device according to claim 9, wherein the coil includes a first coil and a second coil; and
wherein the first coil is constituted by a spiral metal wiring pattern arranged clockwise and gradually inward from a first contact point to a second contact point, the second coil is constituted by a spiral metal wiring pattern arranged counterclockwise and gradually outward from a third contact point to a fourth contact point, and the second contact point and the third contact point are electrically conductive to each other.

15. The magnetic detection device according to claim 14, wherein coil currents flowing correspondingly in the first coil and the second coil flow in the same direction in an area between the second contact point and the third contact point so that a fixed-direction magnetic field occurs above or below the area; and
wherein the magnetic detection portion is disposed above or below the area.

* * * * *